United States Patent [19]

McNeilly et al.

[11] Patent Number: 5,762,755
[45] Date of Patent: Jun. 9, 1998

[54] ORGANIC PRECLEAN FOR IMPROVING VAPOR PHASE WAFER ETCH UNIFORMITY

[75] Inventors: Michael A. McNeilly; John M. deLarios, both of Palo Alto; Glenn L. Nobinger, Santa Clara; Wilbur C. Krusell, San Jose; Dah-Bin Kao, Palo Alto; Ralph K. Manriquez, Saratoga; Chiko Fan, Danville, all of Calif.

[73] Assignee: Genus, Inc., Sunnyvale, Calif.

[21] Appl. No.: 994,604

[22] Filed: Dec. 21, 1992

Related U.S. Application Data

[63] Continuation-in-part of Ser. No. 703,601, May 21, 1991, abandoned.
[51] Int. Cl.$^6$ .................................................. H01L 21/302
[52] U.S. Cl. .................................. 156/652.1; 156/653.1; 156/643.1; 134/1.2
[58] Field of Search .......................... 156/652.1, 653.1, 156/646.1, 643.1; 134/2, 3, 1, 1.1, 1.2

[56] References Cited

U.S. PATENT DOCUMENTS

| | | | |
|---|---|---|---|
| 4,749,440 | 6/1988 | Blackwood et al. | 156/662 |
| 4,885,047 | 12/1989 | Ury et al. | 156/668 |
| 4,906,328 | 3/1990 | Freeman et al. | 156/664 |
| 5,017,513 | 5/1991 | Takeuchi | 437/228 |
| 5,073,232 | 12/1991 | Ohmi et l. | 156/345 |
| 5,078,832 | 1/1992 | Tanaka | 156/646 |
| 5,178,682 | 1/1993 | Tsukamoto et al. | 156/643 |

FOREIGN PATENT DOCUMENTS

| | | |
|---|---|---|
| 462-011129 | 1/1987 | Japan . |
| 62-011129 | 1/1987 | Japan . |
| 63-129633 | 6/1988 | Japan . |
| 63-29633 | 6/1988 | Japan . |
| 01217921 | 8/1989 | Japan . |
| 02910726 | 1/1990 | Japan . |
| 02106927 | 4/1990 | Japan . |

OTHER PUBLICATIONS

Du Pont Brochure H-16577-1, Dec. 1989, "TEFLON AF Amorphous Fluoropolymer".
Du Pont Brochure TEFLON FLUOROCARBON RESIN 1981.
Solid State Technology, Jul. 1990, B.E. Deal, et al. "Vapor Phase Wafer Cleaning: Processing for the 1990s".
J. Electrochem. Soc., vol. 136, No. 5, May 1989, "Electrical Evaluation of Wet and Dry Cleaning Procedures for Silicon Device Fabrication" J. Ruzyllo, et al.
Electrochemical Society: Symposium Proceedings, May 1986, "Application of UV Radiation in Pre-oxidation treatments of silicon Wafers".
Vig, John R., "UV/Ozone Cleaning of Surfaces: A Review", 1978.
Japanese Journal of Applied Physics, vol. 28, No. 12, Dec. 1989, pp. 2421–2424 "Low Temperature Silicon Surface Cleaning by HF Etching/Ultraviolet Ozone Cleaning (HF/UVOC) Method (I)—Optimization of the HF Treatment" Maki Suemitsu, et al.
Treatise on Clean Surface Technology, vol. I, "UV/Ozone Cleaning of Surfaces" John R. Vig. 1987.

(List continued on next page.)

Primary Examiner—R. Bruce Breneman
Assistant Examiner—George Goudreay
Attorney, Agent, or Firm—Donald R. Boys

[57] ABSTRACT

A method for achieving greater uniformity and control in vapor phase etching of silicon, silicon oxide layers and related materials associated with wafers used for semiconductor devices comprises the steps of first cleaning the wafer surface to remove organics, followed by vapor phase etching. An integrated apparatus for cleaning organic and, subsequently, vapor phase etching, is also described.

In embodiments of the invention cooling steps are incorporated to increase throughput, an on-demand vaporizer is provided to repeatably supply vapor at other than azeotropic concentration, and a residue-free etch process is provided.

7 Claims, 4 Drawing Sheets

OTHER PUBLICATIONS

Japanese Journal of Applied Physics. "Low Temperature Silicon Surface Cleaning by HF Etching/Ultraviolet Ozone Cleaning (HF/UVOC) Method(II)—in situ UVOC" Tetsuya Kaneko et al. 1989.

Applied Physics Lett., 45, 1073, 1984 "UV ozone cleaning of silicone substrates in silicon molecular beam epitaxy", Michiharu Tabe.

SPIE vol. 470 Optical Microlithography III. Technology for the Next Decade (1984) "UV/Ozone Cleaning For Organics Removal on Silicon Wafers", Leo Zafonte and Rafael Chiu.

Microcontamination, Mar. 1988, vol. 6(3) "Evaluating The Feasibility of Dry Cleaning of Silicon Wafers", Jerzy Ruzyllo.

1987 Microcontamination Conference, Oct. 1987. "Dry Cleaning of Silicon: Feasibility and Possible Solutions", Jerzy Ruzyllo.

Applied Physics. A 43–223–226 (1987) "Ozone Cleaning of the Si–$SiO_2$ System". H. Baumgartner et al.

Journal of Applied Physics, vol. 64, No. 7, 1988. "The formation of hydrogen passivated silicon single–crystal surfaces using ultraviolet cleaning and HF etching". T. Takahagi et al.

IEEE Transactions on Electron Devices, vol. 37, No. 1, 1990 "Gas–Phase Selective Etching of Native Oxide", Nobuhiro Miki, et al.

Proc. IEEE IEDM, 1988. "Selective Etching of Native Oxide by Dry Processing using Ultra Clean Anydrous Hydrogen Fluoride". N. Miki, et al.

Journal Electrochem Soc., vol. 136, No. 2, 1989. "XPS and SIMS Study of Anhydrous HF and UV/Ozone–Modified Silicon (100) Surfaces". L.A. Zazzera.

Semiconductor International, Oct. 1990 vol. 13(11) "New Wafer Cleaning Know–how" Pieter Burggraf.

Semiconductor International, Aug. 1990. "Clusterable Wafer Cleaning Module Using Vapor Phase Technology".

Brochure, Advantage Production Technology Inc. "EDGE 2000" Preliminary Product Information.

J. Vac. Sci. Tech., A3, pp. 1027–1034 "UV/Ozone cleaning of surfaces" (1985) John R. Vig.

J. Electrochem. Soc., 139, 2051–2055 "Preoxidation UV Treatment of Silicon Wafers" (1987) J. Ruzyllo et al.

ORGANIC PRECLEAN FOR IMPROVING VAPOR PHASE WAFER ETCH UNIFORMITY

CROSS REFERENCE TO RELATED APPLICATIONS

This is a continuation-in-part of application Ser. No. 07/703,601 filed May 21, 1991, now abandoned.

BACKGROUND OF THE INVENTION

This invention relates to a method for achieving greater uniformity and control in vapor phase etching of silicon, silicon oxide layers and related materials associated with wafers used for semiconductor devices, and an apparatus in which the method may be practiced.

Various combinations of oxygen, ozone, infrared (IR) and ultraviolet (UV) radiation have been studied as so-called "dry" process wafer cleaning methods. For example, Ruzyllo et al., "Preoxidation UV Treatment of Silicon Wafers", J. Electrochem. Soc., 134, 2052 (1987), reports the use of ozone in the presence of UV for the removal of carbon containing compounds prior to thermal growth of gate oxides. An earlier work Vig, "Ozone Cleaning of Surfaces", J. Vac. Sci. Tech., A3, 1027 (1985) reports the advantages of using an UV/ozone surface cleaning method, and the UV wavelengths most appropriately used for cleaning different types of materials from wafer surfaces.

Another paper, Zazzera et al., "XPS and SIMS Study of Anhydrous HF and UV/Ozone—Modified Silicon (100) Surfaces," J. Electrochem. Soc., 136, 484 (1989) studies, among other processes, UV/Ozone exposure as a post-HF etch for the removal of carbon containing compounds.

None of these papers, however, discusses the removal of carbon containing matter immediately prior to etching silicon or silicon oxide layers.

Vapor phase etching of silicon and silicon oxide layers has become more attractive for reasons including the use of smaller quantities of acidic etchants, the speed with which etching occurs and the improved etching uniformity needed for effective removal of contaminants from submicron device features. With the decrease in feature size, the need for greater etch uniformity becomes paramount. Thus, it is an object of the invention to identify a method and apparatus by which greater etch uniformity and control can be achieved.

In vapor-phase etching of silicon and silicon oxides, and particularly in combination with cleaning process to remove organic contaminants prior to such etching, which is an object of the present invention, there are a number of difficulties which have heretofore not been fully addressed or controlled. One of these proceeds from the fact that preferred means of cleaning wafer surfaces to remove organics typically involve relatively high temperatures, often higher than 250° C., while vapor-phase etching of silicon oxides is preferably accomplished at near "room" temperature; that is, from about 25° C. to about 30° C. This temperature has to be accomplished on a cyclic basis to provide repeatable performance, and must be quickly accomplished to assure high throughput in processing equipment.

Etching of silicon, typically done by UV excited chlorine, as described in this specification and elsewhere, is usually accomplished at temperatures higher than "room" temperature, but often lower than the cleaning temperature contemplated in the present invention. So in the etching of silicon a cooling step, that is temperature management, is desirable as well.

Another difficulty in such processes is in the means of providing etchant to a chamber in proximity to a wafer to be etched. In the case of HF for etching silicon oxide, HF is provided in aqueous solution in a vaporizer having a heating means, and a carrier gas is passed over the solution surface, entraining HF and water vapor, and carried thence to the processing chamber. It is well known that differing vapor pressures may cause differing depletion of HF and water, and that the concentration of the solution therefore changes, varying the concentration of the vapor entrained.

One means of dealing with the concentration gradient is to an azeotropic mixture of HF and water but this method has the distinct disadvantage of limiting the user to only the azeotropic concentration.

A further difficulty arises from the products of reaction in the etch process. Not all products are volatile. Those that are not volatile tend to be left on the etched wafer, and have to be subsequently removed, which is an additional process step. Elimination of post processing residues is an important goal.

SUMMARY OF THE INVENTION

To achieve this object, the present invention comprises a method of removing organic contaminants from a wafer surface prior to exposing the wafer surface to vapor phase etchants. It has been found that the removal of organics prior to vapor phase etching of silicon, silicon oxide or related materials significantly improves etch uniformity.

In a preferred embodiment, the method comprises exposing a heated organic contaminated wafer to ozone to remove organic matter, followed by vapor phase $HF/H_2O$ oxide or $Cl_2$/UV silicon etching.

In another aspect, the invention comprises an apparatus for carrying out both the "pre-etch" organic cleaning process and the subsequent vapor phase oxide or silicon etch, comprising a pressure controlled chamber for surrounding a wafer, the chamber having vapor inlet and outlet channels and an etchant resistant window for allowing UV and/or IR light to pass from outside the chamber to the surface of the wafer within the chamber. A preferred form of the apparatus utilizes a quartz/Teflon® window assembly. Another preferred form for the window assembly is sapphire.

In preferred aspects, the method of the invention also comprises a step for cooling the wafer after cleaning. The cooling step decreases the time required for a complete cleaning and etching cycle, and therefore increases throughput.

In yet another aspect the invention as disclosed herein provides an on-demand vaporizer comprising solution supply means for containing and supplying a liquid-phase solution of materials at a controlled rate to provide the vapor-phase etchant, flash evaporation means comprising a heated surface for flash evaporating the liquid-phase solution at the rate supplied, and delivery means between the flash-evaporation means and the chamber for delivering the vapor-phase etchant to the chamber.

In an embodiment of the on-demand vaporizer the solution supply means comprises a sealed chamber pressurized by a source of high pressure gas, and liquid is withdrawn through a tube opening beneath the liquid surface. A method for supplying a vapor phase etchant is provided incorporating the on-demand vaporizer. The method is capable of providing etchant materials at virtually any component weight ratio (concentration), and doing so repeatedly, overcoming deficiencies in the existing art.

Finally, in yet another aspect of the invention, a method is provided for minimizing non-volatile reaction products in an HF vapor etching process by controlling the temperature of the wafer in combination with controlling the HF percent in water of the etchant supplied to the process reaction.

BRIEF DESCRIPTION OF THE DRAWINGS

The present invention will be better understood by reference to the attached figures of which.

DETAILED DESCRIPTION OF THE INVENTION

Figure 1:
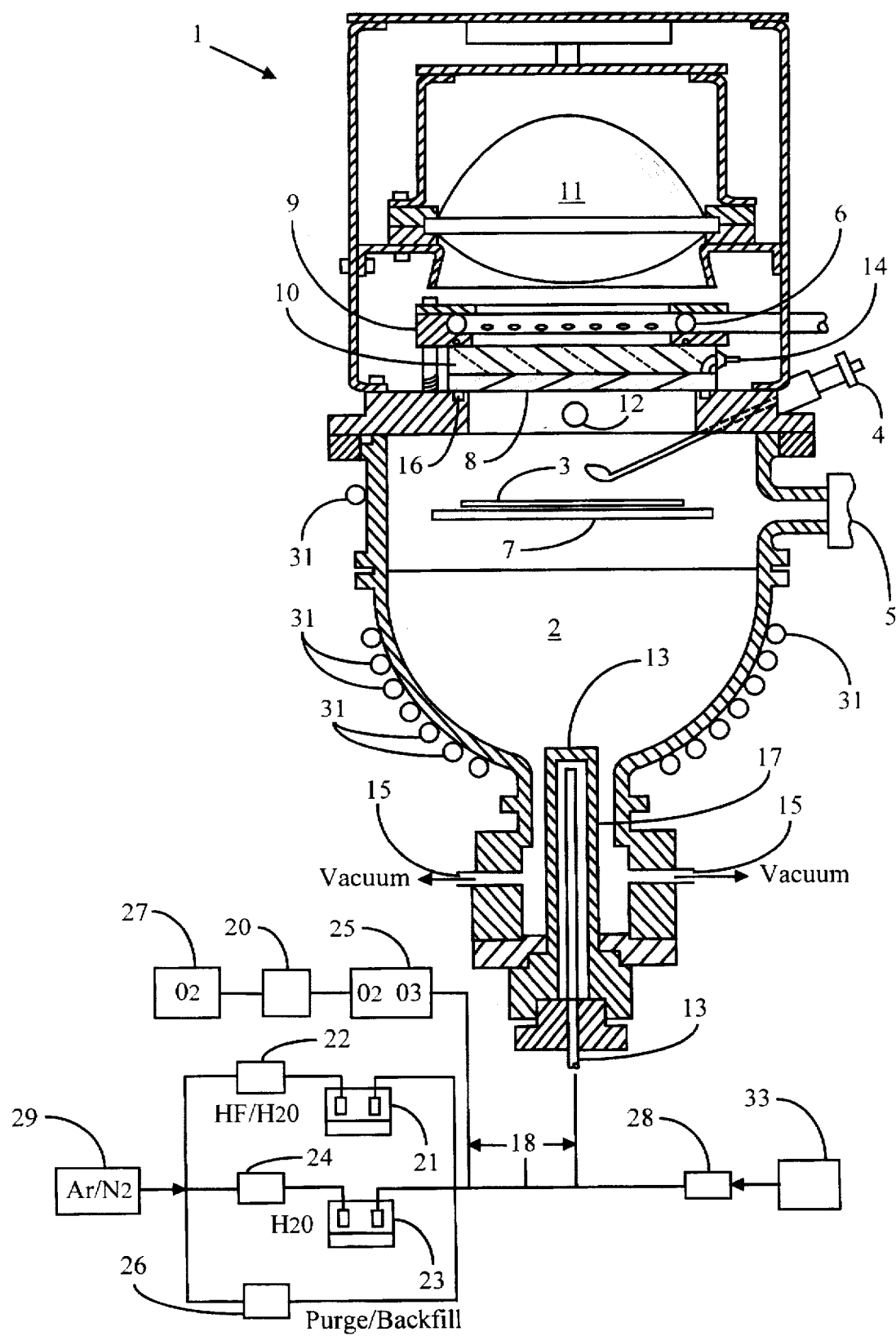
FIG. 1 shows a cross-sectional view of the pressure chamber of the invention.

Silicon oxides, especially those formed thermally by the reaction of silicon with either oxygen ($O_2$) or water vapor ($H_2O$) at temperatures ranging from 800° to 1200° C., are critical in the fabrication of advanced integrated circuits. These oxides range in thickness from less than 100 Å (10 nm) to greater than 5000 Å (0.5 μm). Thermal oxide thicknesses are typically controlled by adjusting oxidation time and temperature. Uses of thermal oxides include gate dielectrics, field oxides, insulators and spacers, capacitors, and others.

In certain cases during device fabrication, thermal oxides must be etched back or removed completely in particular regions. This is generally accomplished by $HF/H_2O$ solutions, sometimes with the addition of a $NH_4F$ buffering agent for better control of pH and concentrations. In the case of vapor phase cleaning and etching technologies, $HF/H_2O$ mixtures are also employed; however, no buffering agent is required. The typical chemistry involved in the etching of thermal oxide ($SiO_2$) with hydrofluoric acid (HF) follows the reaction:

$$4HF + SiO_2 \rightarrow SiF_4 + 2H_2O \qquad [1]$$

In addition to $SiF_4$ and $H_2O$ which can be volatilized, various other intermediate species, such as $H_2SiF_6$, $Si(OH)_4$, and others may remain on the wafer surface and must be removed. In the case of etching oxides part way to the silicon, these are generally not a problem.

While the present invention is directed to an improvement in the uniformity achieved with vapor phase etching, such etching does not form the invention in and of itself. Rather, the invention is a combination of process steps including an organic preclean in conjunction with, and prior to, such etching to achieve better uniformity.

An example of vapor phase $HF/H_2O$ etching which can be used in the present invention is described in PCT application publication number WO 90/04045, published Apr. 19, 1990, the contents of which are hereby incorporated by reference.

In the case of such vapor phase etching or cleaning, the mechanism has been found to involve two steps. The first is that the warm gas mixture being transported to the wafer condenses on the wafer surface - either oxide or silicon. The time required for condensation depends on several factors, including pressure, temperature difference between wafer and vapors, nature of the wafer surface, and concentration of the gas mixture (HF and $H_2O$ for example). Typically, the condensation time (or "delay time") varies from no delay to more than 20 seconds.

As the condensed $HF/H_2O$ layer increases in thickness up to tenths of micrometers or even micrometers, an equilibrium concentration is obtained, and etching of the oxide begins (second step). This etching is essentially identical to that occurring in conventional aqueous etching. At this point, etch rates are dependent only on the $HF/H_2O$ layer concentration and the wafer temperature, not the gas pressure, wafer surface condition, etc. For more dilute HF conditions, delay times are close to zero, while more concentrated HF (less $H_2O$) results in longer delay times. Once oxide etching begins, a linear relationship is obtained and etch rates can be specified.

While water is a reaction product of the $HF/SiO_2$ reaction (see Eq.[1]), water apparently must be present on the oxide surface before the reaction can proceed. Thus, anhydrous HF will not generally etch thermal oxide without the addition of $H_2O$.

Semiconductor wafer surfaces can become contaminated by a variety of organic compounds during wafer fabrication. Examples include photoresist, plasticizers from plastic boxes, human oils, cosmetics, paint fumes and other airborne organics. Such organics may collect on the surface of a wafer over a relatively brief period, for example over an hour or more, even under otherwise clean conditions.

Generally, the effects of surface organics on HF etch uniformity are not significant in conventional liquid HF silicon dioxide etching. This is because with immersion or spray HF etching wetting takes place quickly, and etching begins almost immediately. Since across wafer exposure to liquid etchants and water quenches is very quick relative to etch rates, uniformity is not a problem. Uniformity problems which do occur arise more from the method than from the organic contamination, as long as gross organics from photoresist or plasma have been removed.

Further, the sheer volume of etchant used in liquid etching provides a mechanism for the contaminants removed from the wafer surface to be carried away—again providing for relatively uniformly etched surfaces.

Because vapor phase cleaning occurs in two distinct processes materials which affect the condensation rate will delay the time at which the actual etching portion of the process begins. Organics are believed to affect the vapor phase etching process in this way. Considering the relatively high rate of etching and the differences in the time at which condensation sufficient for etching occurs across the wafer, non-uniformities result.

In order to minimize these non-uniformities various methods of wafer treatment were studied as indicated in the following examples.

EXAMPLE 1

A pre-treatment for the removal of organics from wafer surfaces was developed to test the effect of organic removal on subsequent etch uniformity across wafer surfaces. Hexamethyl-di-silizane (HMDS), an organic primer, was deposited in thin layers on silicon wafers, and the pre-treatment indicated was applied. Analysis of the HMDS material was carried out before HMDS deposition, after deposition and after cleaning using static secondary ion mass spectrometry (SIMS).

Ten wafers were processed under the following conditions:

(1) Ozone produced using 4 liters/minute (LPM) $O_2$ feed to an ozone generator, the ozone then fed to the wafer surface in a pressure controlled chamber.

(2) UV at low power (corresponding to wafer temperature of about 225°–250° C.).

(3) Pressure of 300 Torr.

(4) Exposure time of 60 seconds.

(5) Wafer held horizontally in chamber.

The following results were obtained:

TABLE 1

| WAFER | TYPE | HMDS/Si | Ratio (2 spots/wafer) |
|---|---|---|---|
| 1 | Bare Si-Control | 0.03, | 0.02 |
| 2 | HMDS-Control | 0.91, | 0.89 |
| 3 | Processed | 0.04, | 0.03 |
| 4 | Processed | 0.03, | 0.02 |
| 5 | Processed | 0.12, | 0.09 |
| 6 | Processed | 0.03, | 0.01 |
| 7 | Processed | 0.02, | 0.02 |

These measurements were made using the 73 amu peak $Si(CH_3)_3$ to $^{28}Si$ peak ratio. Additional samples analyzed by a different lab with the following results:

TABLE 2

| WAFER | TYPE | Normalized HMDS to Bare Silicon |
|---|---|---|
| 1 | Bare Si-Control | 1.0 |
| 2 | HMDS-Control | 10.0 |
| 3 | Processed | 0.09 |
| 4 | Processed | 0.26 |
| 5 | Processed | 0.14 |
| 6 | Processed | 0.11 |
| 7 | Processed | 0.18 |
| 8 | Processed Bare Wafer | 0.16 |

These measurements were made using the 43 amu peak which includes the $SiCH_3$ fragment associated with HMDS, but can also include other compositions of the same mass. The data are normalized to the 43 amu peak for the bare Si control. As can be seen from Table 2 strong removal of HMDS is observed and even processed bare silicon wafer (no. 8) is considerably cleaner than the bare silicon control (no. 1) and comparable to the HMDS cleaned wafers (nos. 3–7). For the purpose of Table 2, the 43 amu was reduced by a factor of 6 on the bare silicon wafer.

These experiments indicate the ability to remove nics from wafer surfaces by application of ozone to heated wafer surfaces.

EXAMPLE 2

To test the effectiveness of alternative processes for hydrocarbon removal, an additional series of tests was run.

Eight HMDS contaminated wafers were processed in $O_3/IR(UV)$, $O_3/IR$, and the $N_2/IR(UV)$ processes for different lengths of time. The flows for both $O_2$ and $N_2$ were 4 SLPM, and process pressure was 500 Torr. Static SIMS analysis was performed. The results are listed below in the HMDS/Si peak ratios.

TABLE 3

| Wafer ID | Process | HMDS/Si Ratio Process (two-point average) | Normalized to Bare |
|---|---|---|---|
| Wafer #1 Bare Wafer Control | None | 0.02 | 1.0 |
| Wafer #2 HMDS Control | None | 0.79 | 40.0 |
| Wafer #3 HMDS Wafer | $N_2/IR(UV)$ 180 s | 0.035 | 1.8 |
| Wafer #4 HMDS Wafer | $N_2/IR(UV)$ 180 s | 0.02 | 1.0 |
| Wafer #5 HMDS Wafer | $O_3/IR(UV)$ 45 s | 0.01 | 0.5 |
| Wafer #6 HMDS Wafer | $O_3/IR(UV)$ 100 s | 0.03 | 1.5 |
| Wafer #7 HMDS Wafer | $O_3/IR(UV)$ 180 s | 0.02 | 1.0 |
| Wafer #8 HMDS Wafer | $O_3/IR$ 180 s | 0.015 | 0.8 |
| Wafer #9 HMDS Wafer | $O_3/IR$ 100 s | 0.015 | 0.8 |
| Wafer #10 HMDS Wafer | $O_3/IR$ 45 s | 0.01 | 0.5 |

Note:
IR (UV) indicates the use of a radiation source including both IR and UV radiation. For wafers 3–10 radiation was used to heat the wafer to approx. 250° C.

As can be seen in Table 3, all processes tried were effective for removing HMDS. It is believed that HMDS is a relatively easy organic to remove, and other combinations of heat, ozone and time are likely required for other organics.

EXAMPLE 3

Experiments were next carried out to determine the effect, if any, of organic removal from oxide surfaces on uniformity of oxide etching using azeotropic vapor phase $HF/H_2O$. Results are summarized in Table 4. In this experiment, approximately 1200 Å of oxide were removed from wafers following various pre-treatments as indicated. It was observed quite clearly that all the pre-treatments improved oxide etch uniformity, with No. 6 providing the lowest one-sigma value of 1.27%. This treatment involved 225°–250° C. heating with UV in $N_2$ and then an ozone treatment, with wafers held in a horizontal position.

TABLE 4

| | Description of | Etch Time | Etching Uniformity [Å unless noted] | | | | |
|---|---|---|---|---|---|---|---|
| Wafer number | Pre-Etch Treatments | HF/ $H_2O$ | MEAN | 1 σ [%] | 1 σ | MIN | MAX |
| 1 | Control: No Pre-Treatment | 50 sec. | 1175.0 | 3.60% | 42.3 | 1108 | 1237 |
| 2 | 2.0 Minutes UV + Ozone [Face-up] | 50 sec. | 1216.0 | 1.47% | 17.8 | 1180 | 1244 |
| 3 | 2.0 Minutes UV + Ozone [Face-up] | 50 sec. | 1198.5 | 1.45% | 17.4 | 1155 | 1223 |
| 4 | 2.0 Minutes UV + Oxygen [Face-up] | 50 sec. | 1199.9 | 2.01% | 24.1 | 1152 | 1245 |
| 5 | 3.0 Minutes UV in N2, then 2.0 Minutes N2 soak [Face Down] | 50 sec. | 1178.5 | 1.57% | 18.6 | 1124 | 1204 |

TABLE 4-continued

| Wafer number | Description of Pre-Etch Treatments | Etch Time HF/H₂O | Etching Uniformity [Å unless noted] | | | | |
|---|---|---|---|---|---|---|---|
| | | | MEAN | 1 σ [%] | 1 σ | MIN | MAX |
| 6 | 3.0 Minutes UV in N2, then 2.0 Minutes Ozone soak [Face Down] | 50 sec. | 1168.0 | 1.27% | 14.8 | 1122 | 1194 |

COMMENTS [about etching inhibition], by wafer number:
1 Severe Pre-Etch contamination: ~3.8 cm
2 Some Pre-Etch contamination: Up to ~1.8 cm
3 Some Pre-Etch contamination: Up to ~1.3 cm
4 Some Pre-Etch contamination: Up to ~1.3 cm
5 Some Pre-Etch contamination: Up to ~1.3 cm
6 Cleanest Wafer [apparatus holder cooling effect seen at edge]

For pretreatment, 300 Torr pressure was used, UV at low power (225°–250° C.), and all etching occurred within 40 minutes of pretreatment. The etching process conditions were 125 Torr using 5.0 SLPM $N_2$, using

EXAMPLE 4

During testing of the present invention rooms adjacent to the lab in which wafers were located were painted. Paint fumes in the ambient were found to be responsible for severe degradation of oxide etch uniformity. To study this effect function wafers were purposely exposed to paint fumes. The results are shown in Table 5.

TABLE 5

| Wafer number | Description of Pre-Etch Treatments | Etch Time | Etching Uniformity [Å unless noted] | | | | |
|---|---|---|---|---|---|---|---|
| | | | MEAN | 1 σ [%] | 1 σ | MIN | MAX |
| 1 | CONTROL: Pre-treatment 24 hours before etch. Stored in plastic box | 50 sec. | 1208.8 | 4.56% | 55.1 | 1123 | 1297 |
| 2 | Same as WF #1, + 2nd O3 pre-treat, transport in clean qrtz elephant, immediately etched | 50 sec. | 1270.3 | 1.64% | 20.8 | 1227 | 1316 |
| 3 | Same as WF #1, + 2nd O3 pre-treat, exposed to latex paint fumes ambient for ~60 seconds, then etched | 50 sec. | 1217.3 | 2.86% | 34.8 | 1118 | 1258 |
| 4 | Same as WF #1, + 2nd O3 pre-treat, exposed to latex paint fumes ambient for ~300 seconds, then etched | | | | | | | |
| 5 | Same as WF #1, + 2nd)3 pre-treat, transport in clean qrtz elephant, stored | 50 sec. | 1317.9 | 2.46% | 32.5 | 1255 | 1377 |

TABLE 5-continued

| Wafer number | Description of Pre-Etch Treatments | Etch Time | Etching Uniformity [Å unless noted] | | | | |
|---|---|---|---|---|---|---|---|
| | | | MEAN | 1 σ [%] | 1 σ | MIN | MAX |
| | in the elephant for ~5 minutes, then etched | | | | | | |

COMMENTS [about etching inhibition]
1 Severe organic contamination effect seen
2 Very Clean. No visual evidence of any organic effect
3 Organic effect seen within ~5 mm–10 mm of wafer edge
4 Organic effect seen within ~5 mm–20 mm of wafer edge
5 No visual evidence of any organic effect For pretreatment 300 Torr pressure was used, UV light source at high power (325°–350° C.) using 60 second ozone exposure at 4 SLPM $O_2$ flow into the ozone generator, all etching occurred within 5 minutes of pretreatment. Except where indicated, etching process conditions were 125 Torr, 5.0 SLPM $N_2$ flow, using.

EXAMPLE 6

A series of 24 wafers were oxide etched after opening a new box of wafers. Every other wafer was subjected to UV (heat) and ozone pre-treatment. As can be seen in Table 6, the average one-sigma uniformity value for untreated wafers was 6.17%. For pre-treated wafers the average uniformity was 2.12%.

TABLE 6

| Wafer number | Pretreatment | Amt of ox. etched | Difference 1 σ% |
|---|---|---|---|
| 1 | NO | 459 Å | 7.17 |
| 2 | YES | 392 Å | 2.46 |
| 3 | NO | 472 Å | 6.88 |
| 4 | YES | 428 Å | 2.06 |
| 5 | NO | 474 Å | 6.51 |
| 6 | YES | 432 Å | 1.81 |
| 7 | NO | 482 Å | 6.90 |
| 8 | YES | 431 Å | 2.41 |
| 9 | NO | 489 Å | 5.57 |
| 10 | YES | 427 Å | 2.23 |
| 11 | NO | 489 Å | 7.31 |
| 12 | YES | 446 Å | 2.21 |
| 13 | NO | 487 Å | 5.08 |
| 14 | YES | 432 Å | 1.86 |
| 15 | NO | 483 Å | 5.81 |
| 16 | YES | 475 Å | 2.11 |
| 17 | NO | 505 Å | 5.39 |
| 18 | YES | 426 Å | 2.09 |
| 19 | NO | 485 Å | 6.12 |
| 20 | YES | 441 Å | 2.02 |
| 21 | NO | 481 Å | 5.20 |
| 22 | YES | 430 Å | 2.12 |
| 23 | NO | 496 Å | 6.10 |
| 24 | YES | 433 Å | 2.05 |

Pre-treat. Ave = 2.12% (1.81–2.46)
No Pre-treat. Ave = 6.17% (5.08–7.17)

EXAMPLE 7

4,000 Å wafers were exposed in a Class 10 clean room for 16 hours prior to azeotropic HF/$H_2O$ vapor phase etching. The three pre-treatment splits included (1) no additional treatment, (2) IR heating, and (3) UV/$O_3$ treatment in a UVOCS brand UV/ozone treatment chamber. The details of the process conditions are listed below.

Pretreatment process conditions for (2) and (3):

(2) IR Pre-treatment.

| IR | 4 SLPM O$_2$ | 300 Torr | 120 sec |
|---|---|---|---|

(3) UV/O$_3$ Pre-treatment.

| UVOCS system | 4 SLPM O$_2$ | 760 Torr | 120 sec |
|---|---|---|---|

Azeotropic Etch.

| Frontside etch @ | 5 SLPM HF | 125 Torr | 22 sec |
|---|---|---|---|

Azeotropic etch was done in the Advantage Production Technology Edge 2000 vertical vapor phase processing machine. The effect of the pre-treatments are listed in Table 7, which indicates that both the IR and UVOCS treatments substantially improved the etch uniformity. The IR pre-treatment gave better results than the UVOCS system. The averages of the standard deviations for the three conditions are

| No Pre-treatment | 1σ = 4.1 |
|---|---|
| IR | 1σ = 1.2 |
| UVOCS | 1σ = 1.7 |

TABLE 7

| Wafer No. | Pretreatment | Amount Etched | Range | Std. Dev 1σ |
|---|---|---|---|---|
| 1 | None | 663 | 153 | 4.0 |
| 2 | IR | 672 | 39 | 1.3 |
| 3 | UVOCS | 719 | 47 | 1.8 |
| 4 | None | 648 | 122 | 4.1 |
| 5 | IR/O$_2$ | 686 | 23 | 0.97 |
| 6 | UVOCS | 702 | 59 | 2.1 |
| 7 | None | 693 | 137 | 3.9 |
| 8 | IR | 716 | 39 | 1.4 |
| 9 | UVOCS | 721 | 35 | 1.5 |
| 10 | None | 673 | 144 | 4.3 |
| 11 | IR | 734 | 25 | 1.0 |
| 12 | UVOCS | 774 | 45 | 1.4 |

In light of these data, it is clear that pre-treatment of wafer surfaces to remove organics followed by vapor phase oxide etching results in significantly greater surface uniformity.

EXAMPLE 8

Silicon etch rates were measured on the same system as for Example 1, using an UV-CL$_2$ ambient. Etch times of 60, 180, and 600 seconds were used. The wafers were substrates patterned with windows in a 5,500 Å thermal oxide. Some wafers were given a sequential UV-O$_3$ treatment prior to etching. The wafer surface was formed by opening windows in the thermal oxide with an HF strip, and then removing the resist used to define the windows. A final wet H$_2$SO$_4$:H$_2$O$_2$ clean was used to remove the residual photoresist residues.

The chlorine/UV etch rates delay times for these surfaces were:

| Substrate | Delay Time | Etch Rate |
|---|---|---|
| Untreated | 140 sec | 23.2 Å/sec |
| UV-O$_3$ Pretreatment | 30 sec | 52.6 Å/sec |

The longer initiation (delay) time found for the wafers not pretreated is likely due to hydrocarbon contamination on the surface that would be removed by the UV-O$_3$ pretreatment. The hydrocarbon layer on the untreated surface probably becomes modified by the UV-Cl$_2$ etch, however, its influence continues to affect the etch process, as indicated by the reduced etch rate for the untreated wafers. The masking effect could be due to formation of a very stable silicon carbide layer on the surface of the untreated wafers.

We have found that in addition to improving uniformity for Cl$_2$/UV etching, the organic pre-clean step of the invention shortens the delay time and increases the etch rate. It also minimizes surface roughness on the wafer.

APPARATUS

Figure 2:
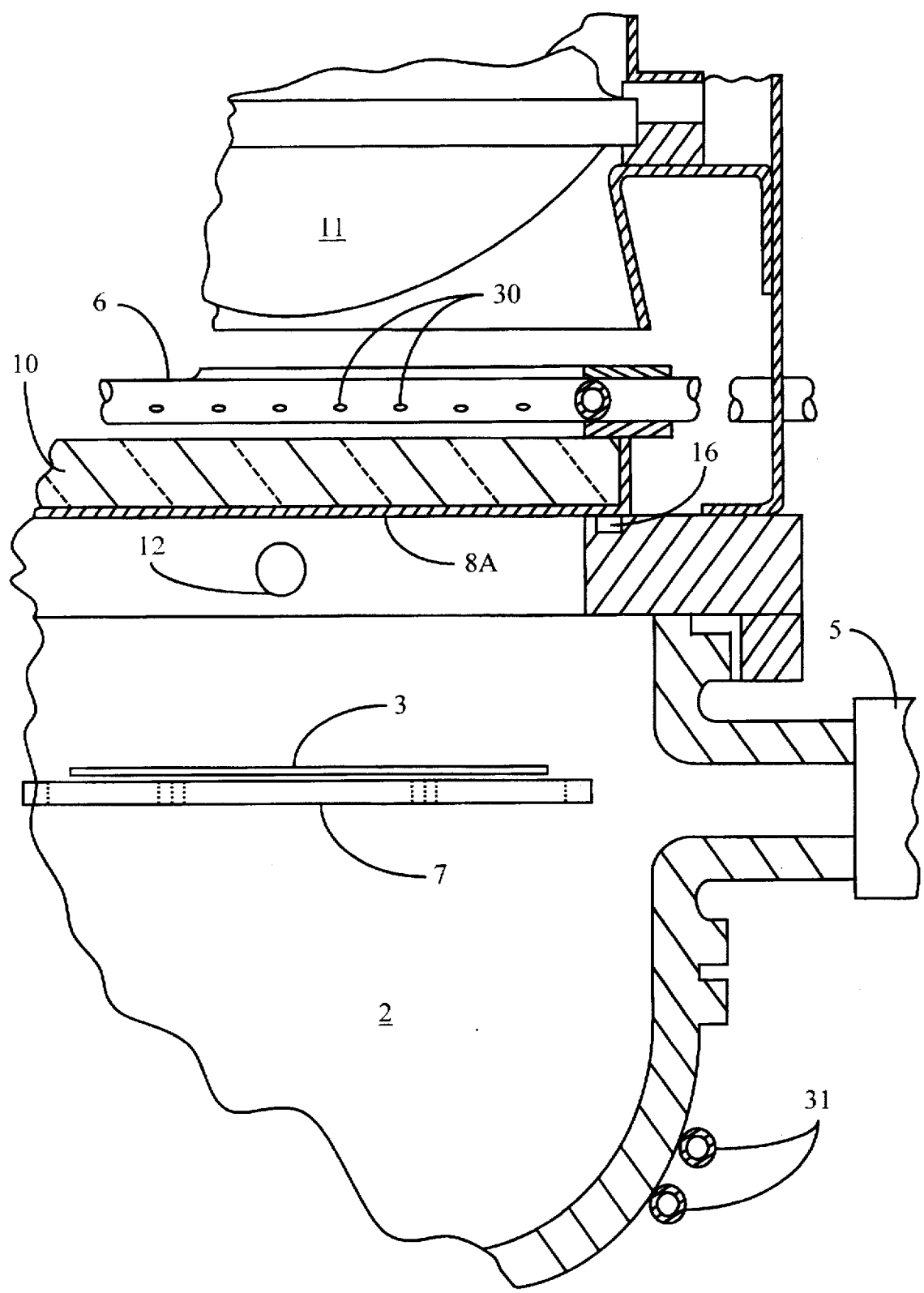
FIG. 2 is a enlarged view of the apparatus shown in FIG. 1 showing an additional embodiment of the UV/IR transparent window assembly used therein.

In light of these findings, a device in which the process of the invention may advantageously be carried out is shown in FIGS. 1 and 2. Depending on the type of wafer handling system with which the apparatus is used, apparatus 1 may be adapted to hold the wafer either vertically or horizontally. In the system as shown, a pressure controlled chamber 2 is shown in cross-section. Within chamber 2, wafer 3 is supported by wafer support ring 7, and enters/exits chamber 2 via access port 5, using a wafer transport mechanism (not shown). Support ring 7 supports wafer 3 around the edges of the wafer such that both faces of wafer 3 are exposed to the atmosphere within the chamber and either backside or frontside etching may be used.

Sealing one end of chamber 2 is window assembly 9. Radiation source 11, such as a UV and/or IR light source, is positioned adjacent window assembly 9 such that when source 11 is operating, radiation will pass through window 9 and heat wafer 3. A number of interchangeable bulbs are available to serve as radiation source 11, depending on the wavelength desired. Any such bulb is suitable which provides the ability, in conjunction with window assembly 9, to heat the wafer surface for organic cleaning and which provides UV in the appropriate 300–400 nm wavelength necessary to form Cl$^-$ from chlorine where chlorine etching is desired. In the experiments described above, a Fusion brand PL-150 Illuminator UV/IR source, among others, was used. Where heating alone is desired, IR in the wavelength 0.8 to 1.2 micrometers may be used.

As is known from PCT application publication WO 90/04045, the desired etchants are supplied via heated vapor lines 18 to inlet port 13. For ozone pre-cleaning, oxygen from oxygen source 27 is passed through mass flow meter 20 to ozone generator 25. Valves within the vapor supply system, as well as pumps and the like, are not shown. Argon and/or nitrogen from source 29 may be used to carry vapor from vaporizers 21 and 23 through mass flow meters 22 and 24 for HF oxide etching. Further, argon and/or nitrogen may be pumped through mass flow meter 26 to purge or backfill the system, as desired.

Alternatively, a source of chlorine 33 may be pumped through mass flow meter 28 for chlorine etching. Vapors exit the chamber through vacuum ports 15.

As was stated above in the section titled BACKGROUND OF THE INVENTION, with conventional vaporizers there is a serious problem with controlling the HF/H$_2$O ratio delivered to the process chamber. As an aspect of the present invention, an On Demand Vaporizer (ODV) is provided to allow delivery of HF/H$_2$O in any ratio desired, and repeatably.

Figure 4:
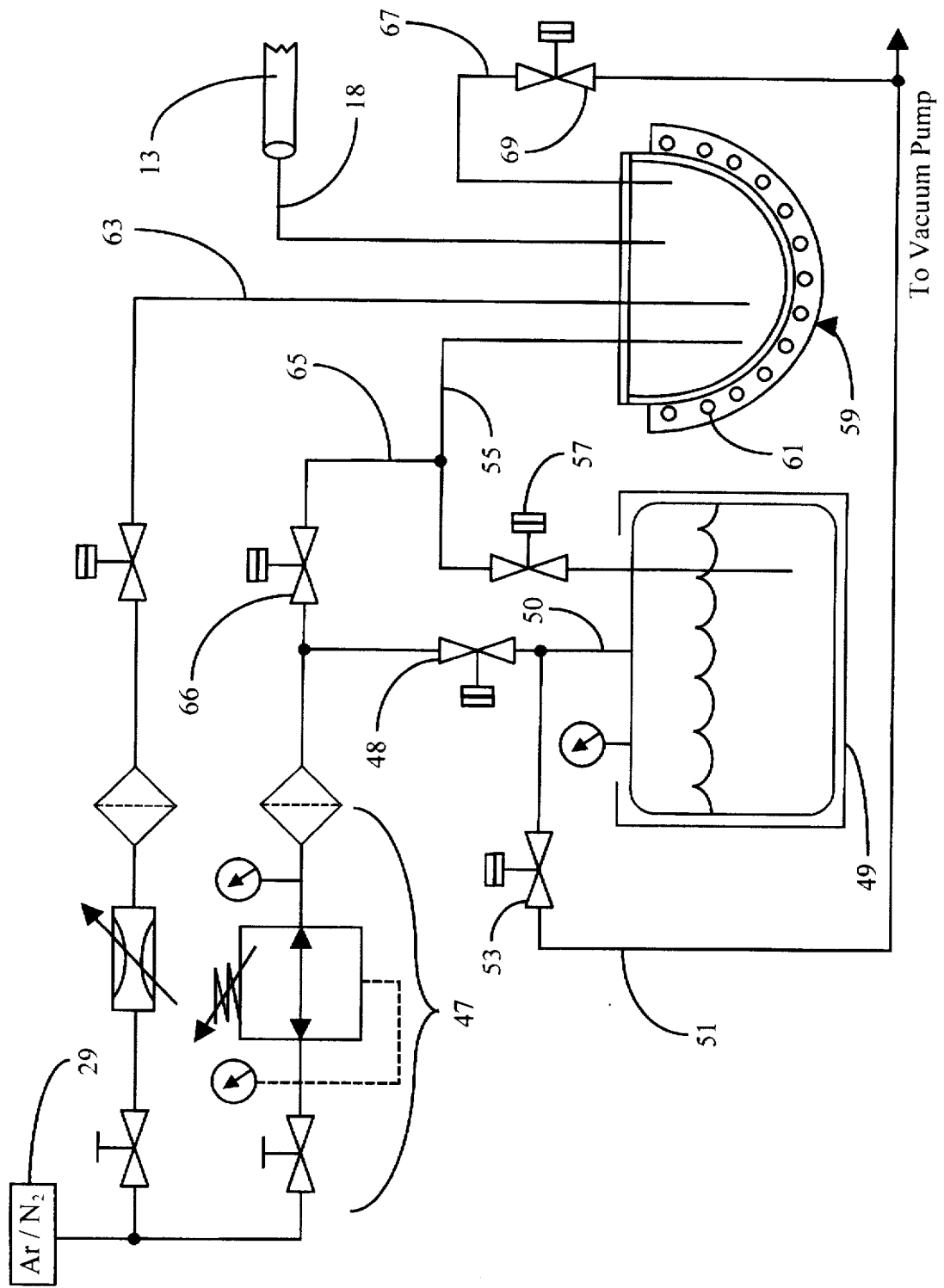
FIG. 4 is a diagram of an on-demand vaporizer according to an embodiment of the present invention.

FIG. 4 is a diagram of an ODV and feed system for use with a process chamber as shown in FIG. 1, or with other process chambers. This system may be used in place of the feed system shown in FIG. 1 or in parallel with that system and used alternatively. Argon/Nitrogen source 29 is common, and the gas under pressure is supplied through valves and a regulator and filter 47 through a remotely-controllable valve 48 to a line 50 to a sealed liquid chemical reservoir 49 containing an HF/H$_2$O solution at a concentration desired for the processing application. The solution in reservoir 49 may be of any concentration desired, such as 38.4%, 4.9%, 49%, etc. Gas fed to reservoir 49 is not a carrier gas, as this gas is not mixed with solution exiting the reservoir.

HF/H$_2$O solution is fed through an exit line 55 from beneath the liquid surface in the reservoir and through a control valve 57 to a flash evaporator 59 heated in this embodiment by coils 61. As a very small volume rate of liquid provides a large amount of vapor, a single liter of solution may accomplish etching of hundreds of wafers. Partly for this reason, line 55 is a capillary tubing, preferably PTFE material, which is essentially impervious to the corrosive materials conducted.

A control line 65 from the same source and at the same pressure as the pressure gas for the reservoir, operating through a remotely-controllable valve 66, intersects capillary feed line 55 and operates as a shut-off device. Partly because of the corrosive nature of the materials, a mechanical shut-off is not reliable, and the arrangement shown provides positive shut off of the solution feed by equalizing the pressure. That is, the pressure at the intersection of lines 55 and 65 becomes the same as the pressure over the liquid in the reservoir, so there can be no flow from the reservoir. There is no pressure gradient to motivate fluid flow. This unique feature provides a reliable means of stopping flow of liquid through line 55 to the flash evaporator.

There is also in the embodiment illustrated an additional line 63 leading to the flash evaporator from the gas supply for introduction of carrier gas to the vapor generated. A vacuum source (not shown) is connected to both the liquid reservoir (line 51 through valve 53) and to the flash evaporator (line 67 through valve 69) to purge the vessels during service procedures.

A feed line from the flash evaporator is labeled line 18, just as in FIG. 1, indicating that the flash evaporator may connect to the same heated gas supply lines shown in FIG. 1. The feed line connects to gas inlet 13, as in FIG. 1. The chamber is not shown in FIG. 4.

The liquid etchant solution is fed to the flash evaporator as a liquid, and the dynamics are such that all of the liquid supplied is flashed to vapor, so the composition of the vapor (mass ratio) is the same as for the liquid. There is no mechanism to alter the chemical composition of the supply during use, so the ratio fed to the chamber is repeatable, and may be of essentially any concentration desired to be fed to the processing chamber.

The unique capabilities of the flash evaporator are (1) The vapor source is concentration repeatable even though the liquid source is not an azeotropic solution. (2) Mixtures of vapors of many chemicals may be supplied. For example HNO$_3$, HCl, OH. (3) Process control may be maintained with known quantities of chemicals.

Chamber 2 will be heated by use of radiation source 11, and chamber walls are cooled externally by circulating water through cooling coils 31. Window assembly 9 is cooled by annular cooling ring 6, external to chamber 2. Cooling ring 6 supplies chilled clean air through orifices 30 equally distributed around the window. When desired, wafer 3 can also be cooled by use of cool gas, such as CO$_2$, passing through tube 12, and into chamber 2. Thermocouple 4 is used to monitor and track the temperature of wafer 3 within chamber 2.

In an embodiment of the present invention, to maximize throughput of wafers, cooled gas is provided to the chamber after ozone cleaning and prior to introducing etchant, to cool the wafer to be etched from the cleaning temperature, which may be above about 250° C., to the etching temperature, which may be as low as about 20° C., and varies in different embodiments to as high as about 80° C. Considering these temperature ranges, the least temperature reduction is about 170° C. The cooled gas may be CO$_2$, as stated above, N$_2$, or some other gas. Inert gases, such as argon, may be used as well.

Figure 3:
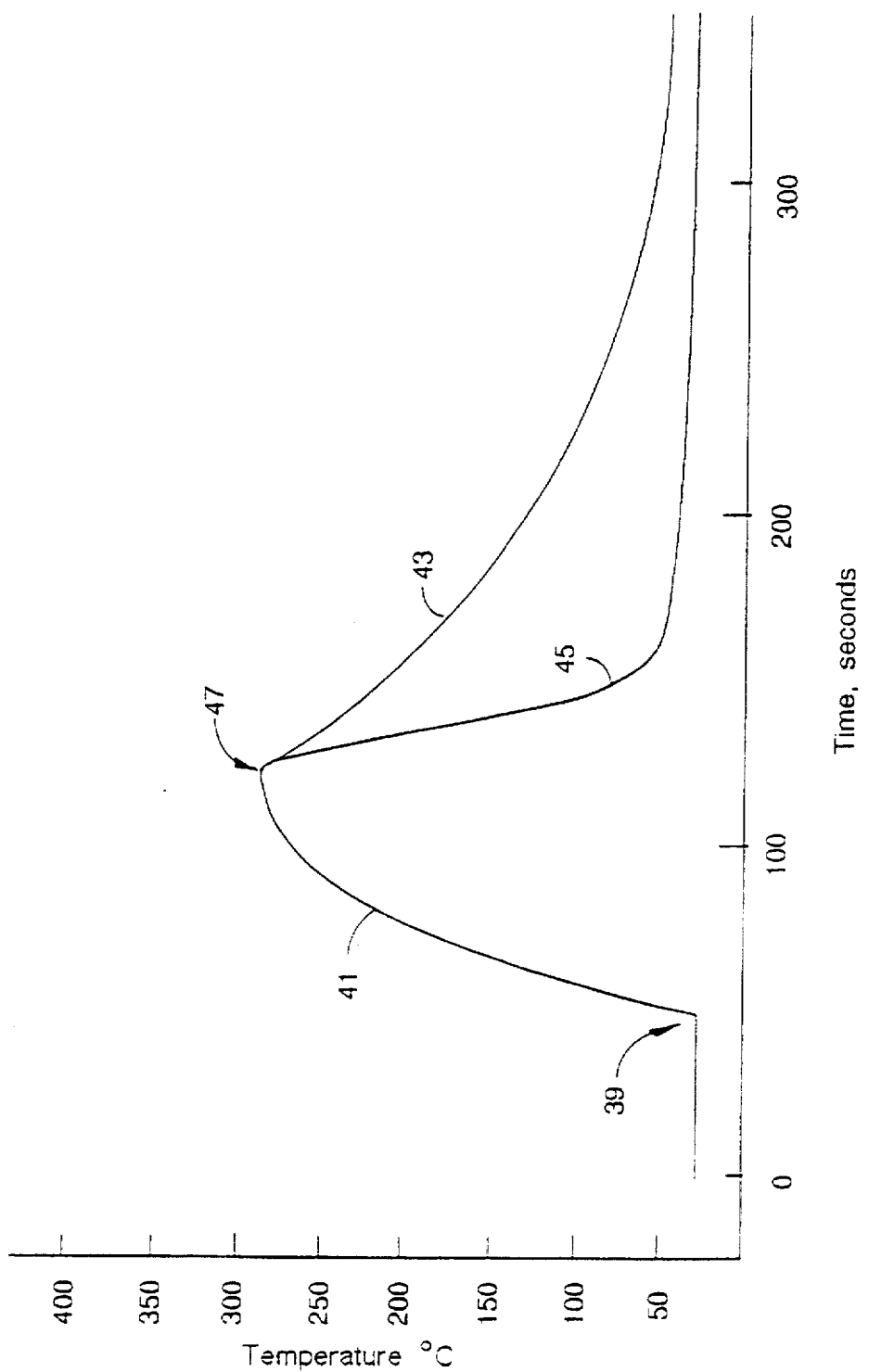
Fig. 3 is a diagram of heating and cooling experiments performed with the apparatus of FIG. 1.

FIG. 3 is a diagram of temperature Vs. time derived from experiments performed with the apparatus of FIGS. 1 and 2. In this experiment a first wafer was heated with a 1000 watt G.E. heat lamp in the apparatus of FIG. 1 beginning at point 39 and extending to point 47, heating the wafer from about 25° C. to about 275° C., and the wafer was then allowed to cool by radiation.

A second wafer was heated under identical circumstances to the first wafer, and then cooled by a flow of about 18.0 slpm cooled N$_2$. Curve 41, the heating portion, is essentially identical for both wafers. Curve 43 shows the radiation cooling for the first wafer, and curve 45 shows the convection cooling for the second wafer. The convection cooling saves about two minutes in an overall cleaning and etching cycle.

An important element of the apparatus is window assembly 9. Assembly 9 comprises upper window 10, and lower window 8. A two window assembly is used to assure strength and to allow lower window 8 to be formed from a corrosion resistant material. Highly corrosive materials such as HF vapor used for wafer etching require the use of a window material which will not degrade. Additionally, any material used in window assembly 9 must necessarily allow the desired UV and IR wavelengths to pass.

We have found it is most desirable to use as lower window 8 an amorphous copolymer material described in detail in U.S. Pat. No. 4,754,009, the entire disclosure of which is incorporated herein by reference, which material is sold under the trademark Teflon® AF by DuPont Polymer Products Department, Wilmington, Del. This material exhibits the necessary stability and radiation passing characteristics required in the present apparatus and process. A window thickness of about ¼ inch is preferred. As upper window 10, a ½ inch thick fused quartz available from General Electrics quartz products division (GE124), about 7½ inches in diameter is preferred. Dynasil 5000 synthetic fused quartz can also be used.

Positioned adjacent window assembly 9 at the interface between windows 8 and 10, is vacuum nozzle 14, through which a vacuum may be applied between windows 8 and 10. This assures that any gasses are drawn from the window assembly which might affect the performance of the apparatus. While it is preferred to use this two window assembly, it is also possible to use a one window assembly under certain process conditions, where that window is sufficiently resistant to corrosive etchants. Window assembly 9 is sealed in the apparatus using "O"-ring seal 16.

An alternative window arrangement which has been found to work satisfactorily in the invention is shown in FIG. 2. FIG. 2 is an enlarged view of a portion of the apparatus of FIG. 1. The elements of FIG. 2 are in all respects the same as FIG. 1 with the exception of window assembly 9. In FIG. 2, window assembly 9 now comprises a quartz window, optimally about ½ inch thick having a layer 8A of FEP (fluorinated ethylene propylene) polymer 2 mils thick surrounding the quartz for protection from HF, chlorine and the like. Teflon® FEP resin which is preferably used (available from DuPont Polymers) is a copolymer of tetrafluoroethylene and hexafluoropropylene having the formula $[CF(CF_3) —CF_2(CF_2—CF_2)_n]_m$. It is preferred that layer 8A of the resin be from about 2 mil to about 5 mil in thickness. It has been found that the film is most advantageously put in place around the optical grade quartz window (Dynasil 5000 synthetic fused quartz brand window or GE124, about ½ inch thick) by thermal wrapping, which wrap can be accomplished by American Durafilm.

Another alternative window arrangement comprises a window of a single crystal of, which is $Al_2O_3$. Sapphire has the advantage of being essentially impervious to the corrosive etchants used, and is also extremely hard, resisting scratching that can occur with the other alternatives described above. Sapphire also is essentially transparent to UV and IR radiation at the wavelengths typically used for heating and etching in embodiments of the invention. Sapphire has the disadvantage of being considerably more expensive.

The apparatus of the invention, particularly in those embodiments comprising an ODV, has further unique utility in providing etch processes with reduced or eliminated residues.

In HF etching of silicon oxides, the primary products are, as stated above, $SiF_4$ and $H_2O$. Both of these species are easily volatilized. There are, however, intermediate species, such as $H_2SiF_6$, $Si(OH)_4$, and others, that are non-volatile at the process conditions. Typically it is necessary to post-clean etched wafers to remove such non-volatile by products of the process.

It is known to the inventors to reduce or eliminate the formation of non-volatile by products of the etch process by establishing conditions for the etch that shift the reaction equilibrium. One approach is to replace water in the process by another substance, such as $CH_3OH$. Another approach known to the inventors is to perform the etch at a temperature slightly higher than the "room" temperature, such as at 30° C., and to pay particular attention to gas distribution.

The inventors, however, have found an even better approach having available to them the ODV, which allows repeatable application of virtually any concentration of $HF/H_2O$ vapor. In this unique approach, a concentration higher than the azeotrope 38.4% is used, and the process temperature is increased to considerably higher than formerly used.

In some embodiments of the present invention, and in other processes known to the inventors wherein HF is combined with water, ethanol, or similar substances to form a vapor-phase etchant, the etching process temperature is kept quite low, such as at room temperature, because it is seen to be necessary to condense liquid phase material on a wafer surface from the vapor supplied to initiate high rate etching of materials on the wafer surface. The inventors have discovered that at concentrations higher than the azeotropic concentration, and at higher temperatures, high rate etching may also be accomplished, and without apparent condensation on the wafer surface. It is believed that a new mechanism is involved wherein the reaction takes place at the point of process with reactants and products dynamically interchanging in the adjacent volume in vapor form, with sufficient interchange to sustain a continuing etching reaction. It may be that the higher temperature, providing higher diffusion rates in the vapor phase, is partly responsible for the success of this new form of vapor-phase etching.

In a preferred embodiment of a residue-free etch (RFE) process, the ODV delivers 49% by weight $HF/H_2O$, and the temperature of the substrate is maintained at from 40° C. to 100° C., preferably 80° C. The temperature control is by radiation through window assembly 9 (FIG. 1), and the concentration is maintained by use of the ODV, which has the capability of repeatably delivering a higher or lower than azeotropic concentration.

In the process of the invention, using apparatus 1 of FIGS. 1 and 2, the organic pre-clean and subsequent silicon or oxide etch can now take place in a single unit to achieve improvements in overall etch uniformity. In addition, decreases in the vapor phase etch delay time, increases in the rate of etching, and reduced surface roughness are achieved for etching silicon.

While the preferred apparatus and method have been described, other embodiments which achieve the same function as recognized by those skilled in the art are intended to be encompassed in the appended claims. For example, it is within the scope of the invention to utilize a conventional resistance heater to heat the wafer and simply use the appropriate UV wavelengths for chlorine etching, i.e., without using any infrared for heating. In such an instance, the integrated apparatus including the appropriate window assembly is still used to great advantage.

What is claimed is:

1. A method of etching silicon on a surface of a semiconductor wafer, the surface having organic contaminants thereon, comprising steps of:

(a) holding said wafer in a partial vacuum, heating said wafer surface to a temperature of at least 200° C. by radiation through a window, and exposing the heated surface to ozone;

(b) cooling said wafer surface to a temperature at or below 80° C.; and (c) exposing said surface to UV-excited chlorine.

2. The method of claim 1 wherein in step (c) said chlorine is provided as a component of an aqueous vapor.

3. The method of step 2 wherein said chlorine is excited by UV radiation provided through a window in the chamber.

4. The method of claim 2 wherein the aqueous vapor containing chlorine is provided to the chamber by injecting a non-azeotropic solution of HCl into a flash evaporator, and conducting the resulting vapor to the processing chamber.

5. The method of claim 1 wherein all of the steps are carried out in a single processing chamber.

6. The method of claim 1 wherein, in cooling step (b), cooling is accomplished by introduction of a cooled gas.

7. The method of claim 6 wherein the cooled gas is one of carbon dioxide, nitrogen, and argon.

* * * * *